United States Patent
Tsai et al.

(10) Patent No.: US 10,403,479 B1
(45) Date of Patent: Sep. 3, 2019

(54) FIELD EMISSION ENHANCED HANDHELD ATMOSPHERIC PRESSURE PLASMA GENERATOR

(71) Applicant: National Tsing Hua University, Hsinchu (TW)

(72) Inventors: Hung-Yin Tsai, Hsinchu (TW); Tzu-Yun Lin, Taichung (TW); Yi-You Chen, Taichung (TW); Shang Ru Wu, Taichung (TW); Tung Che Lee, New Taipei (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 16/369,733

(22) Filed: Mar. 29, 2019

(30) Foreign Application Priority Data

Jan. 25, 2019 (TW) .............................. 108102892 A

(51) Int. Cl.
 *H01J 37/32* (2006.01)
 *H05H 1/24* (2006.01)
 *H01J 37/073* (2006.01)

(52) U.S. Cl.
 CPC ...... *H01J 37/32568* (2013.01); *H01J 37/073* (2013.01); *H01J 37/32082* (2013.01); *H01J 37/32449* (2013.01); *H01J 37/32825* (2013.01)

(58) Field of Classification Search
 CPC ........... H01J 37/32009; H01J 37/32082; H01J 37/3244; H01J 37/2816; H01J 37/32825; H01J 37/32568; H01J 37/32449; H01J 1/304; H01J 9/025; H05H 1/24; H05H 1/2406; H05H 1/46; H05H 1/30; H05H 2240/10; H05H 2240/20; H05H 2001/466
 See application file for complete search history.

(56) References Cited

U.S. PATENT DOCUMENTS

| | | | |
|---|---|---|---|
| 4,668,365 A * | 5/1987 | Foster | C23C 16/045 118/50.1 |
| 5,499,938 A * | 3/1996 | Nakamoto | H01J 1/3042 445/50 |
| 6,137,231 A * | 10/2000 | Anders | H01J 37/32027 118/723 E |
| 6,335,281 B1 * | 1/2002 | Segi | C23C 16/4581 438/680 |

(Continued)

*Primary Examiner* — Haissa Philogene
(74) *Attorney, Agent, or Firm* — Muncy, Geissler, Olds & Lowe, P.C.

(57) ABSTRACT

A field emission enhanced handheld atmospheric pressure plasma generator includes: a main body having a positioning slot, a receiving slot and a gas inlet; a cathode body having a first part positioned in the positioning slot; an anode frame and a positioning member both accommodated within the receiving slot; and a cover having a plasma channel and covering the main body. One or each of two sidewalls of the anode frame and the cathode body facing each other has a nanocarbon material layer. A second part of the cathode body passes through the anode frame, is positioned and fixed by the positioning slot and is separated from the anode frame by a gap. The anode frame and the cathode body receive radio frequency power to make a gas, which enters the receiving slot from the gas inlet and passes through the gap, become plasma outputted from the plasma channel.

12 Claims, 10 Drawing Sheets

(56) References Cited

U.S. PATENT DOCUMENTS

| | | | | |
|---|---|---|---|---|
| 7,091,441 B1* | 8/2006 | Kuo | ........................ | H05H 1/30 |
| | | | | 219/121.36 |
| 7,327,089 B2* | 2/2008 | Madocks | .............. | H01J 27/146 |
| | | | | 118/723 DC |
| 7,780,866 B2* | 8/2010 | Miller | ............... | H01J 37/32623 |
| | | | | 216/68 |
| 8,328,982 B1* | 12/2012 | Babayan | .................... | C23F 4/00 |
| | | | | 118/715 |
| 8,685,213 B2* | 4/2014 | Kouznetsov | ............ | C23C 14/35 |
| | | | | 204/192.12 |
| 9,771,266 B2* | 9/2017 | Matsumoto | ............ | B82Y 40/00 |
| 2009/0142514 A1* | 6/2009 | O'Neill | .................... | H05H 1/46 |
| | | | | 427/595 |

\* cited by examiner

FIELD EMISSION ENHANCED HANDHELD ATMOSPHERIC PRESSURE PLASMA GENERATOR

CROSS-REFERENCE TO RELATED APPLICATIONS

This application claims priority of No. 108102892 filed in Taiwan R.O.C. on Jan. 25, 2019 under 35 USC 119, the entire content of which is hereby incorporated by reference.

BACKGROUND OF THE INVENTION

Field of the Invention

The invention relates to a plasma generator, and more particularly to a field emission enhanced handheld atmospheric pressure plasma generator.

Description of the Related Art

Plasma is the fourth fundamental state of matter in addition to solid, liquid and gaseous states, wherein the gas is ionized in the high electromagnetic field to form a high reactive gas group, which consists of electrons (with negative charges), positive ions (negative ions in some occasions), active free radicals and neutral gas molecules and usually emit light from itself. In the normal condition, the total number of the positive charges is substantially equal to the total number of the negative charges in the plasma, so that the plasma has the quasi-neutral property.

At present, the plasma technology has been widely applied to various industries, such as the opto-electronic and semiconductor industry, 3C and vehicle component industry, livelihood and food chemical industry, bio-med material industry, baking and adhesive pretreatment industry, air and water pollution treatment industry and the like. However, today's maturest plasma technology is mostly carried out under the vacuuming process, so that many drawbacks are present. For example, vacuuming wastes the time, the vacuuming apparatus costs high, the maintenance fee is high, the article's dimension is restricted by the dimension of the chamber, and the online continuous processes cannot be performed. Because the atmospheric pressure plasma technology is free from the above-mentioned limitations, the apparatus and operation costs are low, the operation speed is high, and is applicable to the continuous operation processes, the atmospheric pressure plasma technology can be easily combined with other continuous apparatuses to dramatically improve the production efficiency. At present, the atmospheric pressure plasma technology has become one of the subjects of the active research in the industry and academia.

At present, the maturer plasma generation technology is the low-pressure plasma system, and has the advantage of generating plasma with the low energy consumption. However, it needs to be operated in the low-pressure environment, the time for vacuuming is long, and the dimension of the chamber restricts the applicability. Furthermore, the vacuuming system is more complicated and has the high price and the high maintenance cost. Due to the above-mentioned limitations, the low-pressure plasma system has been replaced with the room temperature atmospheric pressure plasma technology, which can be developed and applied to various fields, such as surface treatment, contaminant removal, plasma synthesis and the like. However, compared with the low-pressure plasma system, the atmospheric pressure plasma system has the drawback that the higher energy needs to be used to generate the plasma, and thus still needs to be further improved.

BRIEF SUMMARY OF THE INVENTION

It is therefore an object of the invention to provide a field emission enhanced handheld atmospheric pressure plasma generator using cathode field emission technology to enhance the plasma generating efficiency and provide the energy saving effect.

To achieve the above-identified object, the invention provides a field emission enhanced handheld atmospheric pressure plasma generator, which includes a main body, a cathode body, an anode frame, a positioning member and a cover. The main body has a positioning slot, a receiving slot and a gas inlet. The cathode body has a first part and a second part connected together, and the first part is positioned in the positioning slot. The anode frame has an anode opening, and is accommodated within receiving slot, wherein one or each of two sidewalls of the cathode body and the anode frame facing each other has a nanocarbon material layer. The positioning member has a positioning opening and is accommodated within the receiving slot, wherein the second part of the cathode body passes through the anode frame and is partially accommodated within the positioning opening, and the second part of the cathode body is positioned and fixed by the positioning slot and separated from the anode frame by a gap. The cover has a plasma channel communicating with the receiving slot and covers the main body, wherein the anode frame and the cathode body receive radio frequency power to make a gas, which enters the receiving slot from the gas inlet and passes through the gap, become plasma outputted from the plasma channel.

In the atmospheric pressure plasma generator, the sidewall of the cathode body may have a nanocarbon material layer, or the sidewall of the anode frame may have a nanocarbon material layer. The anode opening and the cathode body may have corresponding circular cross sections or rectangular cross sections. The nanocarbon material layer may include multiple nanocarbon material sheets respectively disposed in multiple depressed portions of the cathode body. The nanocarbon material layer may include multiple nanocarbon material sheets respectively disposed in multiple depressed portions of the anode frame. An inner sidewall of the positioning member forming the positioning opening has multiple ribs, and the ribs rest against the second part of the cathode body. The plasma channel is gradually tapered from the receiving slot, and the second part of the cathode body may have a first tapered surface and a second tapered surface, the first tapered surface and one sidewall of the receiving slot form a convergence channel along a flowing path of the gas, and the second tapered surface and one sidewall of the positioning opening of the positioning member form a divergence channel along a flowing path of the plasma.

The field emission enhanced handheld atmospheric pressure plasma generator can further include a radio frequency power generator, which is electrically connected to the cathode body and anode frame, and provides the radio frequency power; and a gas supply source, which is connected to the gas inlet and provides the gas entering the receiving slot.

With the above-mentioned field emission enhanced handheld atmospheric pressure (open-type) plasma generator, the cathode field emission technology is adopted to enhance the plasma generating efficiency, and the energy saving effect can be provided. Therefore, the handheld atmospheric pressure plasma generator provided by the invention has the advantages that the volume is small, that the generator can be easily held, and that the generator can perform the flexible operation for the surface treatment of the object. In addition, the nanocarbon material functions as the emitter electrode, and the carbon material depositing process is easy and has the low cost. In addition, the user can quickly replace the electrode material or positioning member to adjust the gap, and can perform the surface treatment on the material with different gases.

Further scope of the applicability of the present invention will become apparent from the detailed description given hereinafter. However, it should be understood that the detailed description and specific examples, while indicating preferred embodiments of the present invention, are given by way of illustration only, since various changes and modifications within the spirit and scope of the present invention will become apparent to those skilled in the art from this detailed description.

DETAILED DESCRIPTION OF THE INVENTION

Recently, the research on field emission cathode materials tends to be well developed, many related components, which emit electron beams using conventional thermal electron guns, can be replaced by the field emission cathode materials to provide an electron source, and this makes the field emission application become much more diversified. The invention provides a field emission enhanced handheld atmospheric pressure plasma generator capable of enhancing the performance of an atmospheric pressure plasma system by the field emission technology.

In this invention, a field emission cathode made of a nanocarbon material is used in combination with the atmospheric pressure plasma generation technology to design the handheld atmospheric pressure plasma generator, wherein the bombardment rate on the gas molecules is increased through electrons emitted from the field emission cathode end, so that the gas can be broken down to generate the plasma with the lower power, thereby improving the drawback of the atmospheric pressure plasma system to achieve the energy saving effect.

Figure 1A:
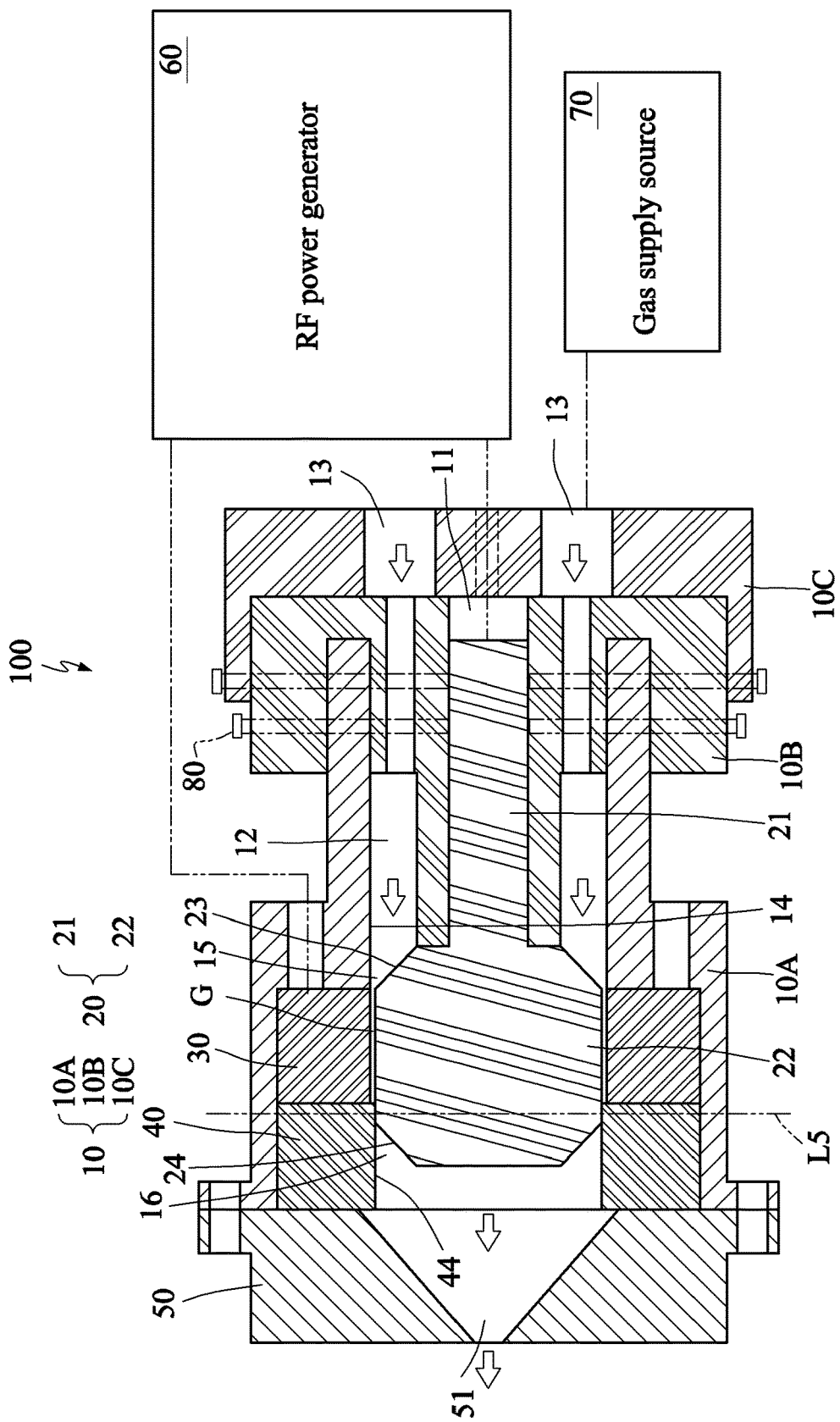
FIG. 1A is a schematically cross-sectional view showing an atmospheric pressure plasma generator according to a preferred embodiment of the invention.
Figure 1B:
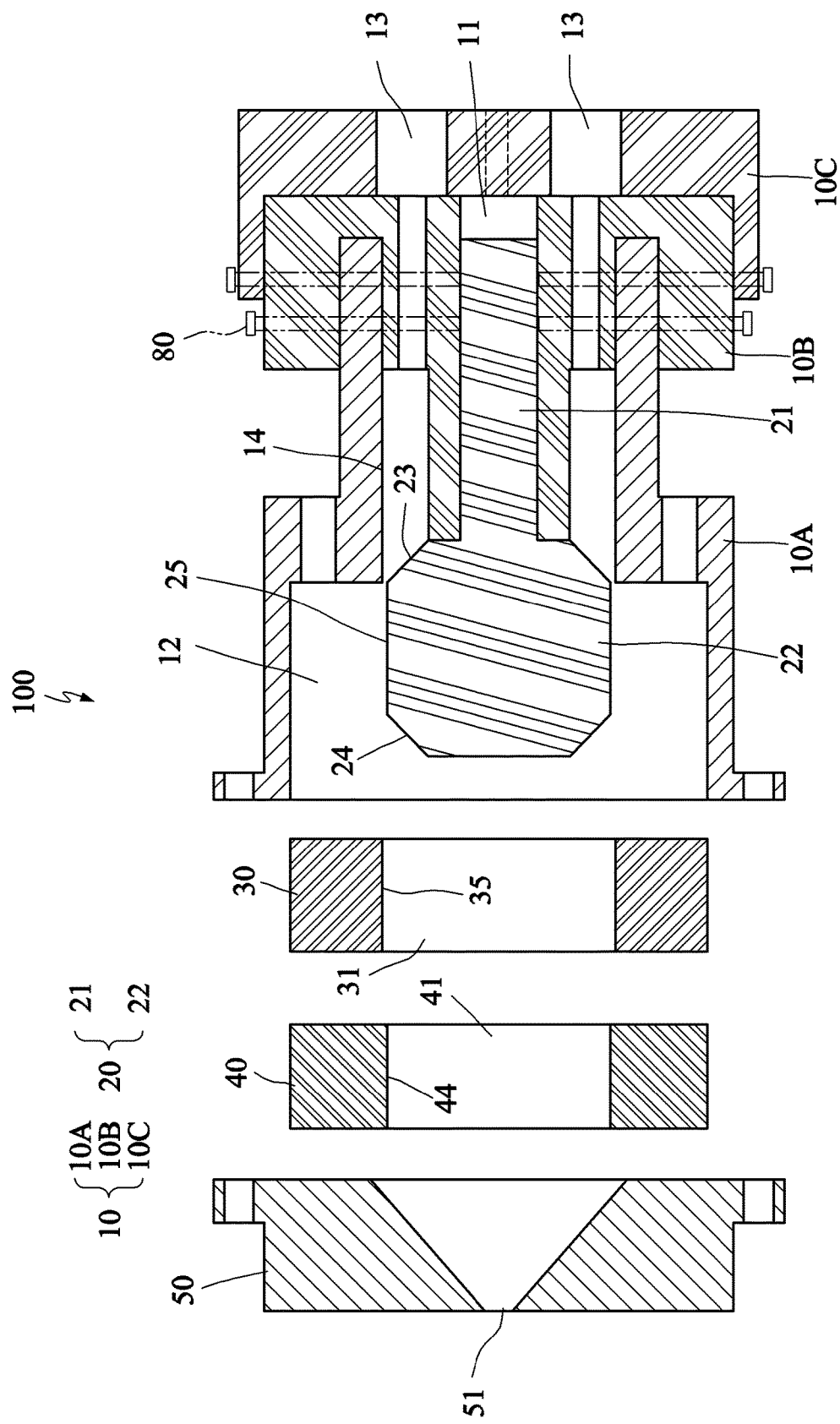
FIG. 1B is a partially cross-sectional exploded view showing the atmospheric pressure plasma generator according to the preferred embodiment of the invention.

FIGS. 1A and 1B are respectively a schematically cross-sectional view and a partially cross-sectional exploded view showing an atmospheric pressure plasma generator according to a preferred embodiment of the invention. As shown in FIGS. 1A and 1B, a field emission enhanced handheld atmospheric pressure plasma generator 100 of this embodiment includes a main body 10, a cathode body 20, an anode frame 30, a positioning member 40 and a cover 50.

The main body 10 has a positioning slot 11, a receiving slot 12 and a gas inlet 13. In this embodiment, the main body 10 includes a housing 10A, a first base 10B and a second base 10C, all of which may be integrally combined together through multiple bolts 80 by way of screwing.

The cathode body 20 has a first part 21 and a second part 22 connected together, and the first part 21 is positioned in the positioning slot 11 and may also be fixed through the bolts 80.

The anode frame 30 has an anode opening 31 and is accommodated within the receiving slot 12. One or each of two sidewalls 25 and 35 of the cathode body 20 and anode frame 30 facing each other has a nanocarbon material layer 26 or 36. The nanocarbon material is used for the application of the electric field and the energy to cause the electrons generated after field emission, and to provide the plasma under the lower energy to achieve the object of energy saving.

The positioning member 40 can be named as the cathode-anode positioning pad, which has a positioning opening 41 and is accommodated within the receiving slot 12. The second part 22 of the cathode body 20 passes through the anode frame 30 and is partially accommodated within the positioning opening 41, and the second part 22 of the cathode body 20 is positioned and fixed by the positioning slot 11 and separated from the anode frame 30 by a gap G, for example, a ring-shaped gap or an annular gap.

The cover 50 has a plasma channel 51 communicating with the receiving slot 12 and covers the main body 10, and can also press the positioning member 40 toward the anode frame 30. The anode frame 30 and the cathode body 20 receive radio frequency power to make a gas, which enters the receiving slot 12 from the gas inlet 13 and passes through the gap G, become plasma outputted from the plasma channel 51.

In addition, the field emission enhanced handheld atmospheric pressure plasma generator 100 may further include a radio frequency (RF) power generator 60 and a gas supply source 70. The radio frequency power generator 60 is electrically connected to the cathode body 20 and the anode frame 30, and provides the radio frequency power. The gas supply source 70 is connected to the gas inlet 13, and provides the gas entering the receiving slot 12.

In addition, the plasma channel 51 is gradually tapered from the receiving slot 12, and the second part 22 of the cathode body 20 has a first tapered surface 23 and a second tapered surface 24, the first tapered surface 23 and one sidewall 14 of the receiving slot 12 form a convergence channel 15 along a flowing path of the gas, and the second tapered surface 24 and one sidewall 44 of the positioning opening 41 of the positioning member 40 form a divergence channel 16 along a flowing path of the plasma. Therefore, the gas may be firstly converged through the convergence channel 15 and pass through the gap G to become the plasma, and then the plasma is diverged through the divergence channel 16, and finally converged through the plasma channel 51, so that the output plasma becomes smoother and stabler.

Figure 2A:
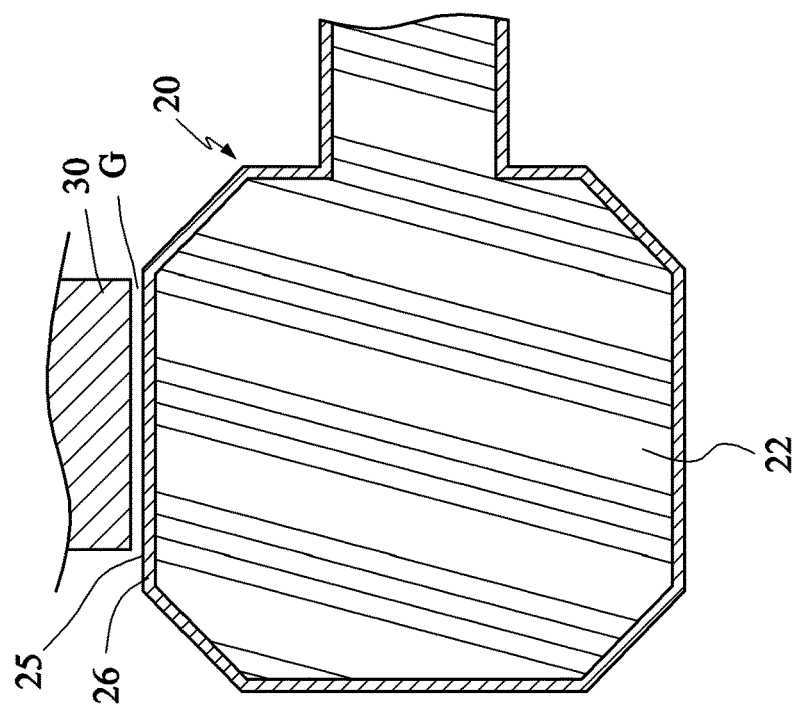
FIGS. 2A and 2B and FIGS. 3A to 3D are partial cross-sectional views showing multiple examples of cathode bodies and anode frames.
Figure 2B:
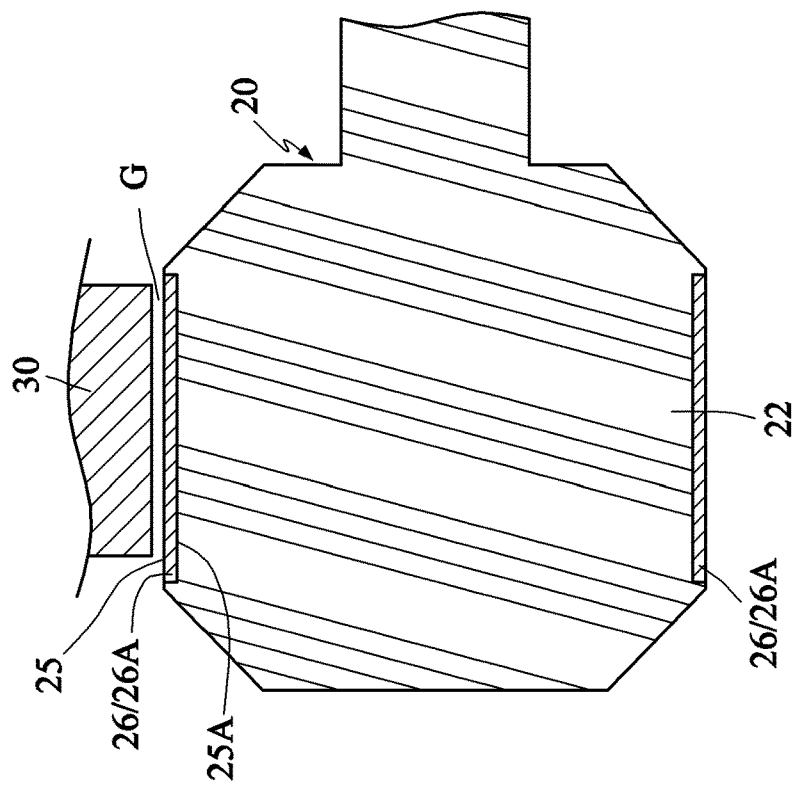

FIGS. 2A and 2B and FIGS. 3A to 3D are partial cross-sectional views showing multiple examples of cathode bodies and anode frames. In FIGS. 2A and 2B, a sidewall 25 of the cathode body 20 (or named as the cathode copper pillar) has a nanocarbon material layer 26. In FIG. 2A, the cross-section (perpendicular to the drawing sheet) of the second part 22 may be circular, rectangular or any other shape. The nanocarbon material layer 26 is attached to an outer surface of the second part 22, and the nanocarbon material may be deposited on the cathode copper pillar by way of electrophoretic deposition, so the nanocarbon material can cover most of the second part 22 of the copper pillar.

In FIG. 2B, the cross-section (perpendicular to the drawing sheet) of the second part 22 may be polygonal, and the nanocarbon material layer 26 includes multiple nanocarbon material sheets 26A respectively disposed in multiple depressed portions or cavities 25A of the cathode body 20. For example, a nanocarbon material substrate synthesized by the chemical vapor deposition is used as the nanocarbon material sheet 26A, and the conductive adhesive is used to bond the nanocarbon material sheet 26A to the depressed portion 25A. Therefore, these nanocarbon material sheets 26A may be obtained by way of a mass production and dicing.

Figure 3A:
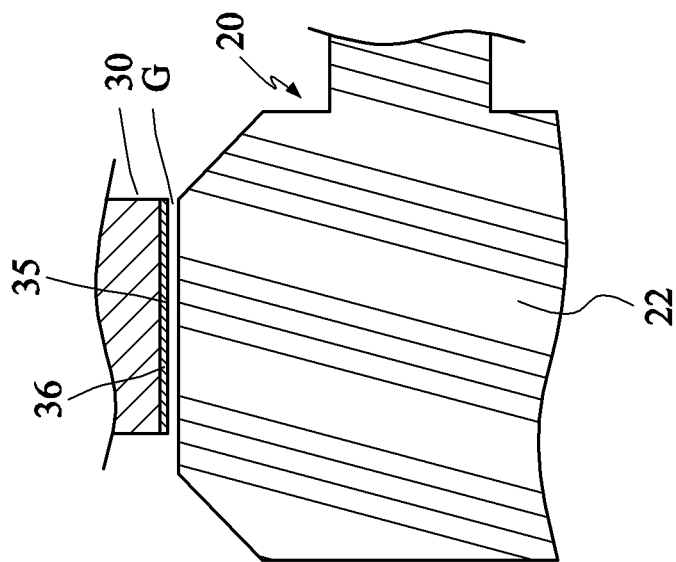
Figure 3B:
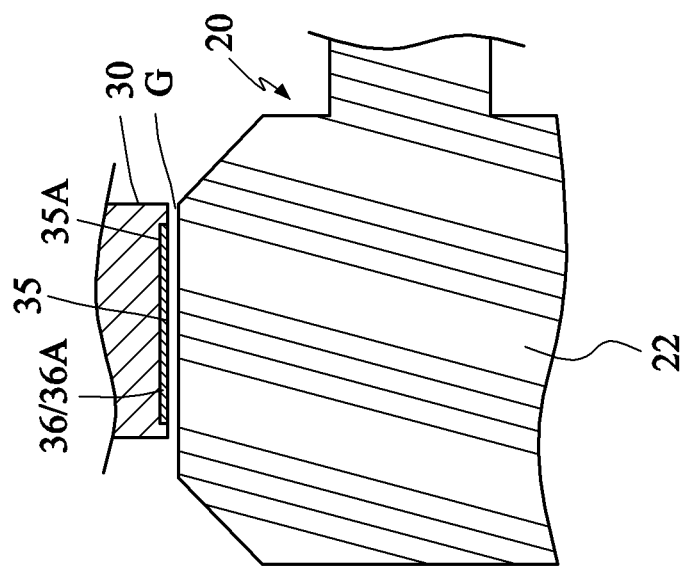

In FIGS. 3A and 3B, a sidewall 35 of the anode frame 30 has a nanocarbon material layer 36. In FIG. 3A, the cross-section (perpendicular to the drawing sheet) of the second part 22 may be circular, rectangular or any other shape. The nanocarbon material layer 36 is attached to the inner surface (sidewall 35) of the anode frame 30, and the nanocarbon material may be formed by way of electrophoretic deposition. In FIG. 3B, the cross-section (perpendicular to the drawing sheet) of the second part 22 may be polygonal, the nanocarbon material layer 36 includes multiple nanocarbon material sheets 36A respectively disposed in multiple depressed portions or cavities 35A of the anode frame 30, and the configuration and production methods are similar to FIG. 2B.

Figure 3C:
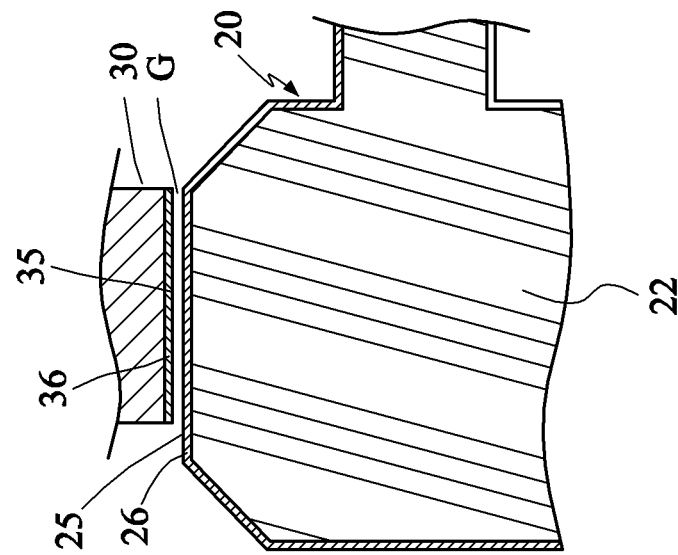
Figure 3D:
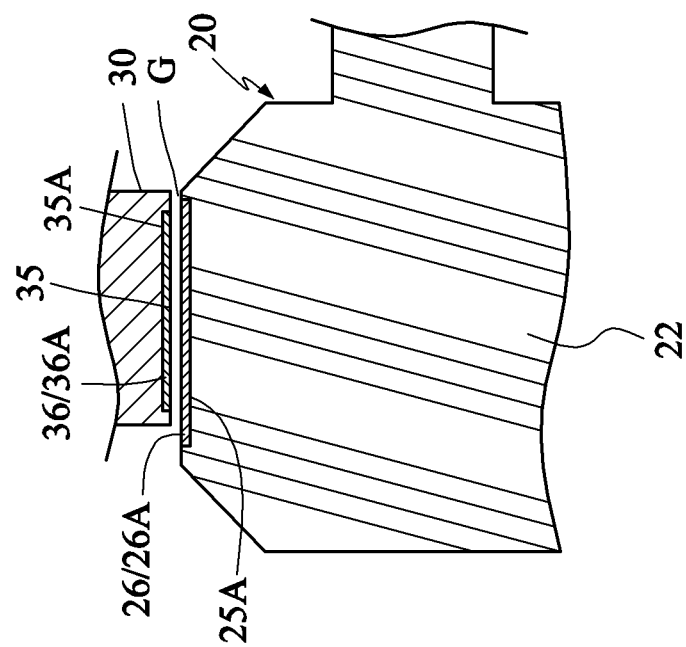

In FIG. 3C, the structures of FIG. 2A and FIG. 3A are combined together. Therefore, the sidewall 25 of the cathode body 20 has the nanocarbon material layer 26, the sidewall 35 of the anode frame 30 has the nanocarbon material layer 36, and the nanocarbon material layers 26 and 36 may be formed by way of electrophoretic deposition. In FIG. 3D, the structures of FIG. 2B and FIG. 3B are combined. Therefore, the nanocarbon material layer 26 includes: multiple nanocarbon material sheets 26A respectively disposed in multiple depressed portions 25A of the cathode body 20; and multiple nanocarbon material sheets 36A respectively disposed in multiple depressed portions 35A of the anode frame 30. By disposing the nano-material layers on the two opposite sidewalls 25 and 35 of the cathode body 20 and the anode frame 30, the effect of the invention can also be achieved.

Figure 4A:
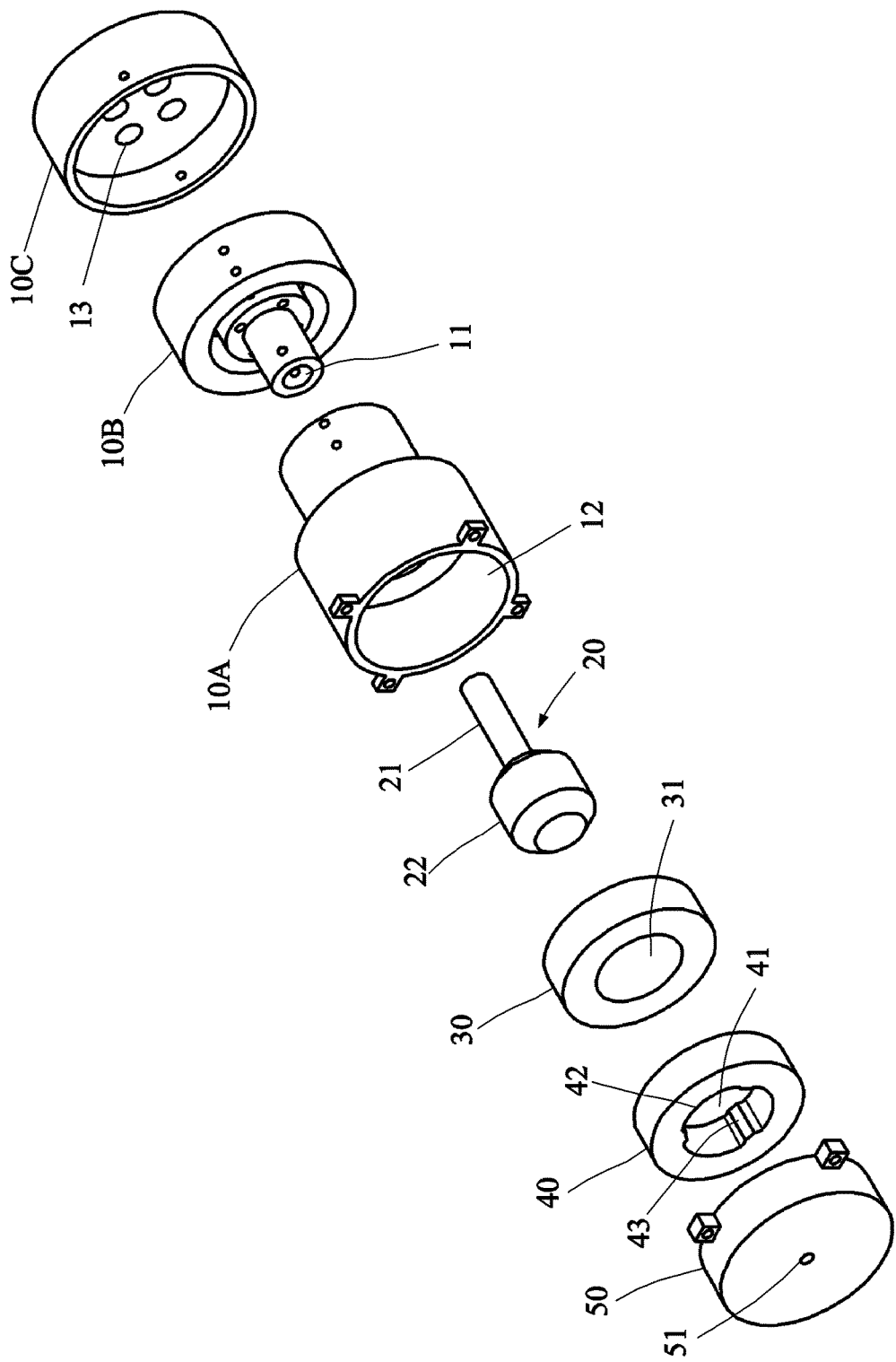
FIGS. 4A and 4B are pictorially exploded views showing two examples of the atmospheric pressure plasma generator of FIG. 1A.
Figure 4B:
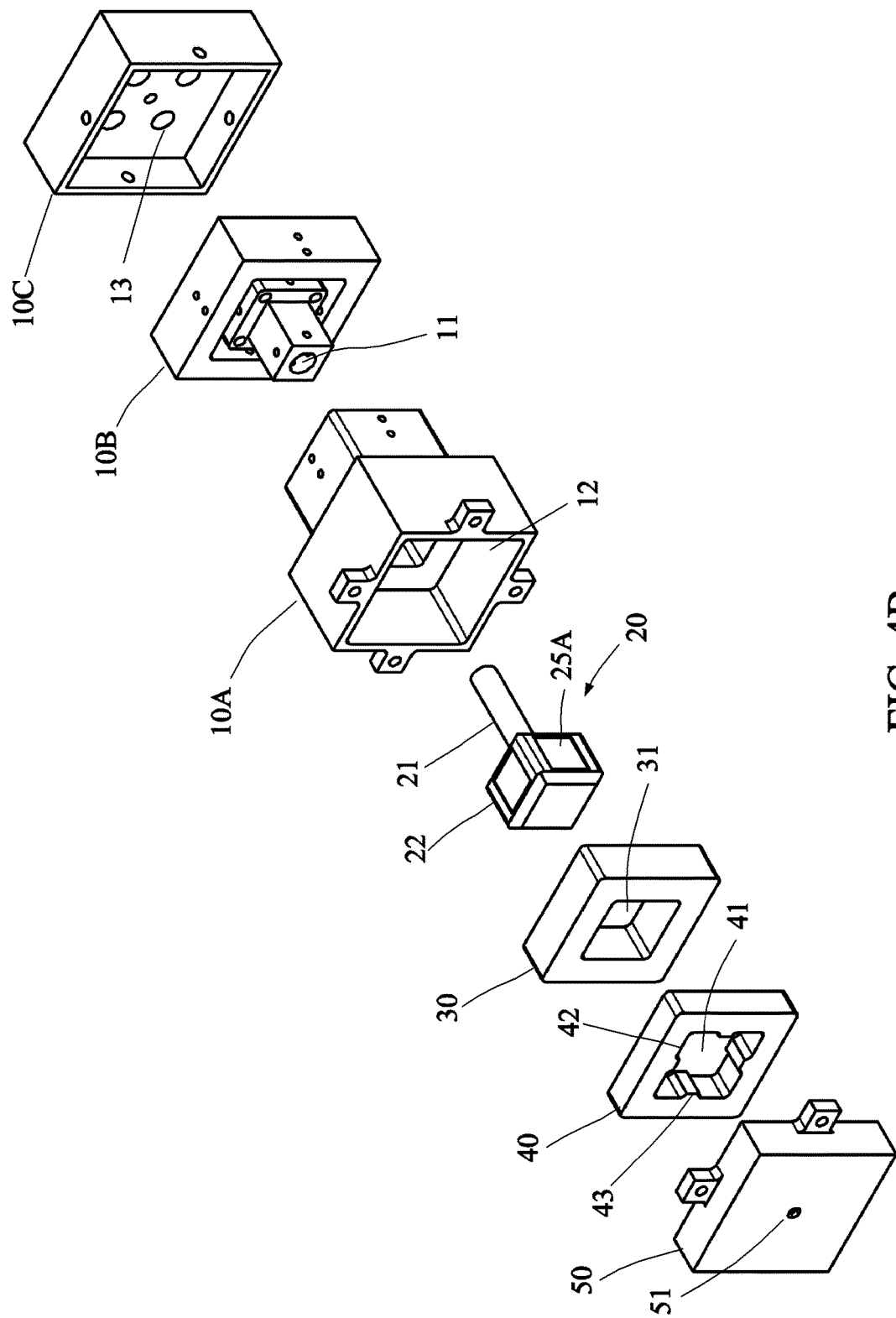

FIGS. 4A and 4B are pictorially exploded views showing two examples of the atmospheric pressure plasma generator of FIG. 1A. In the example of FIG. 4A, the circular anode opening 31 is adopted, so that the anode opening 31 and the cathode body 20 have corresponding circular cross sections. Please refer to FIGS. 1A and 1B, the material of the housing 10A is the insulating polytetrafluoroethylene (PTFE) for carrying assemblies of the positioning member 40 and the anode frame 30, and the sidewall screw hole (not labeled) is formed for the purpose of fixing the housing 10A, the first base 10B, the second base 10C and the cathode body 20; the first base 10B and the second base 10C for fixing the cathode body 20 and the housing 10A are made of insulating PTFE materials, and four through holes at the bottom of the second base 10C are the gas inlets 13 for allowing the gas output from the gas supply source to enter the receiving slot 12. The cathode body 20 is a cathode copper pillar, the thinner first part 21 and the main body 10 are combined and fixed by the bolt 80, the thicker second part 22 is the location where the nanocarbon material is deposited, the nanocarbon material may be deposited at this location by way of electrophoretic deposition, and the chamfer is to make the air-flow smoother. The anode frame 30 is an anode copper ring having a hollow configuration, and functions as the anode of the device. The cathode-anode positioning pad is made of the insulating PTFE material, has a hollow configuration, and has three ribs 43 having the height of 500 μm and mainly functioning to prevent direct contact between the cathode and the anode after high energy is applied and thus to prevent the short-circuit and danger. Thus, the gap G between the cathode and anode may be kept at 500 μm. The cover 50 is made of an insulating PTFE material having excellent erosion-resistance (hydrofluoric acid resistance) and high breakdown voltage (the resistivity is $10^{18}$ Ωm) for the purpose of fixing the positioning member 40 and the anode frame 30 inside the housing 10A, and the tapered design of the front end is to converge the generated plasma. In one example, all components of FIG. 4A combined together have a length of 85 mm, and a radius of 54 mm.

Please refer to FIG. 4B in conjunction with FIGS. 1A and 1B, this example is similar to the example of FIG. 4A except for that the rectangular anode opening 31 is adopted, so that the anode opening 31 and the cathode body 20 have corresponding rectangular cross sections. The second part 22 of the cathode body 20 is rectangular, and has a replaceable design. A square cavity (depressed portion 25A) with a side length of 15 mm and a depth of 500 μm is formed on each of the four surfaces of the second part 22, and is used for the mounting of the nanocarbon material field emitter. The nanocarbon material substrate synthesized by the chemical vapor deposition may be directly mounted in the cavity by attaching the copper foil tape to the cavity, and the design has advantage that a single-sided inefficient emitter can be individually replaced with a new one without replacing the entire electrode, so that the cost can be saved and the electrode can be quickly repaired. In addition, each of the four end edges of the electrode is also chamfered to reduce the gas flow resistance and make the plasma be uniformly generated. The anode frame 30 is made of a copper material and is a rectangular ring electrode having a length of 48 mm, a width of 48 mm and a thickness of 15 mm, the center of the electrode is formed with the square opening (anode opening 31) having a side length of 23 mm, and its sidewalls function as the anode of the device. The positioning member 40 is made of an insulating PTFE material, is a hollow rectangular ring, and has four ribs 43 with the height of 500 μm for the purpose of preventing the contact between the cathode and the anode, and thus preventing the short-circuit. Thus, the gap between the cathode and anode can be kept at 500 μm. The tapered front end of the cover 50 is a nozzle air channel (plasma channel 51) to reduce the generation of the vortexes, and can guide and converge the air-flow. In one example, all components of FIG. 4B combined together have a length of 85 mm, and a width of 54 mm.

Figure 5A:
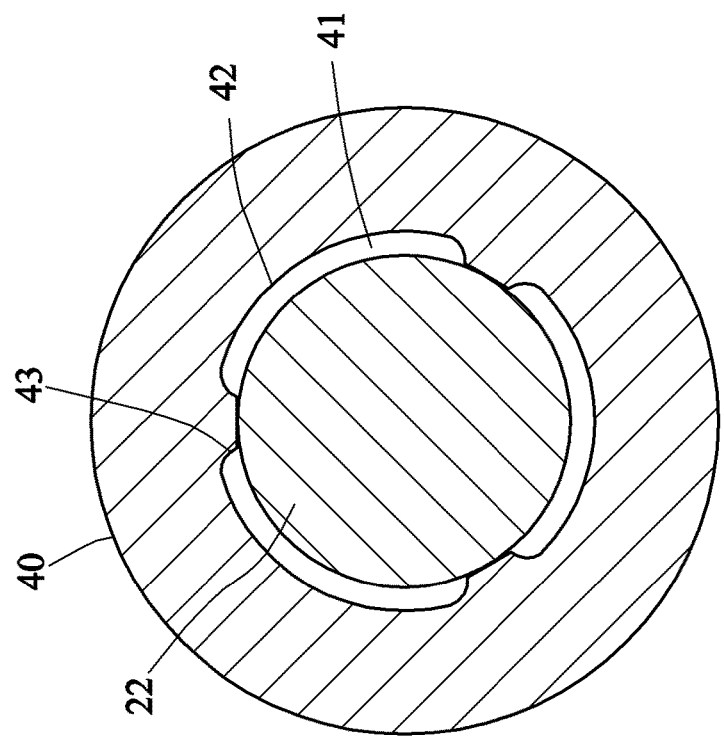
FIGS. 5A and 5B are cross-sectional views showing two examples of the positioning member taken along a line L5 of FIG. 1A.
Figure 5B:
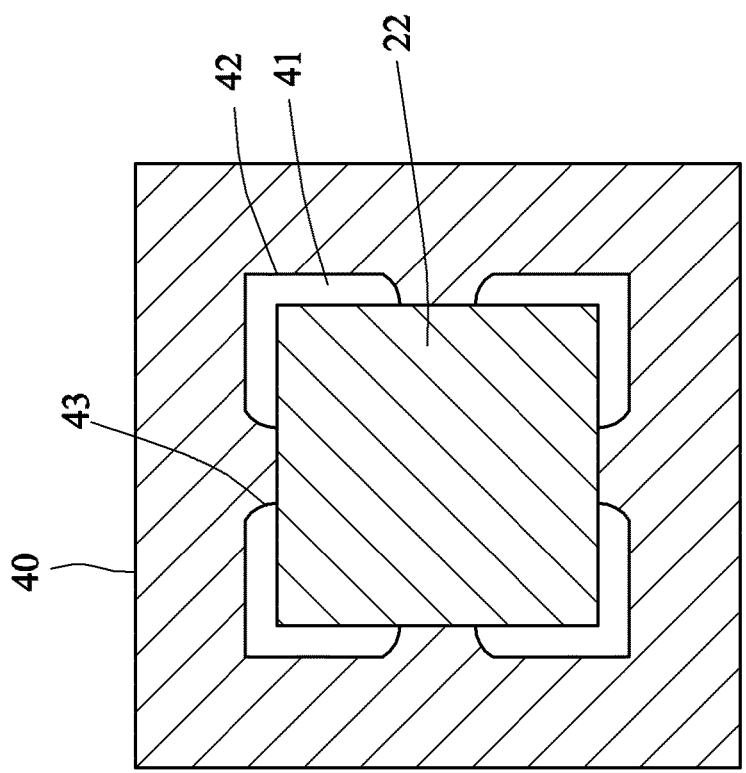

FIGS. 5A and 5B are cross-sectional views showing two examples of the positioning member taken along a line L5 of FIG. 1A. As shown in FIGS. 5A and 4A, an inner sidewall 42 forming the positioning member 40 of the positioning opening 41 has three ribs 43 resting against the second part 22 of the cathode body 20. As shown in FIGS. 5B and 4B, the inner sidewall 42 has four ribs 43 resting against the second part 22 of the cathode body 20.

In order to test the effect of the nanocarbon material layer, the following experiment is to compare the results of the pure copper cathode body (also referred to as the pure copper electrode) with the results of the cathode body attached with the nanocarbon material (also referred to as the carbon nanotube electrode). If the resistance value between the cathode and anode is lower, then it represents that more gas molecules are dissociated into the electron states, and the generated plasma is better.

Figure 6A:
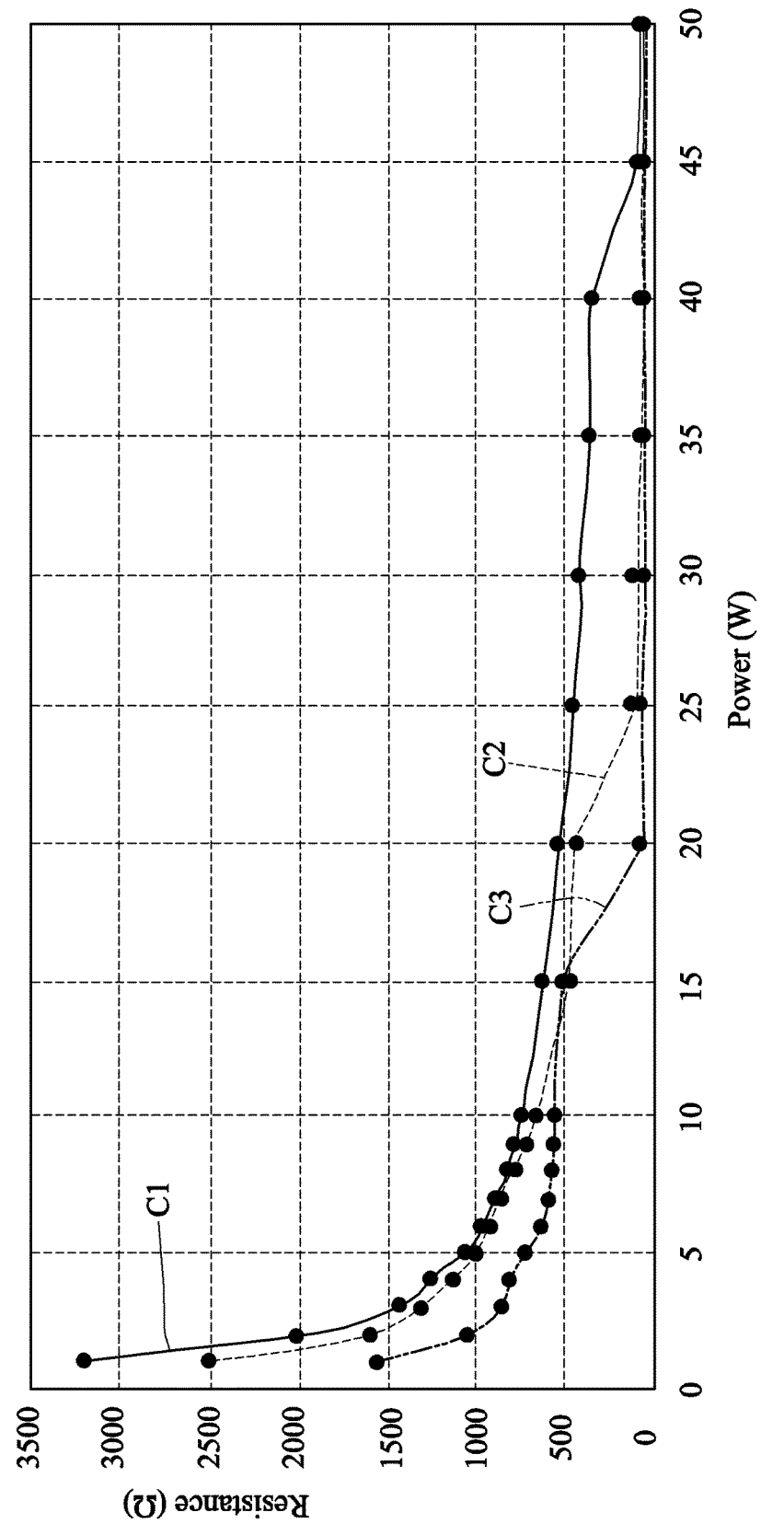
FIGS. 6A and 6B are graphs showing equivalent resistances corresponding to the plasma generated in FIGS. 4A and 4B.
Figure 6B:
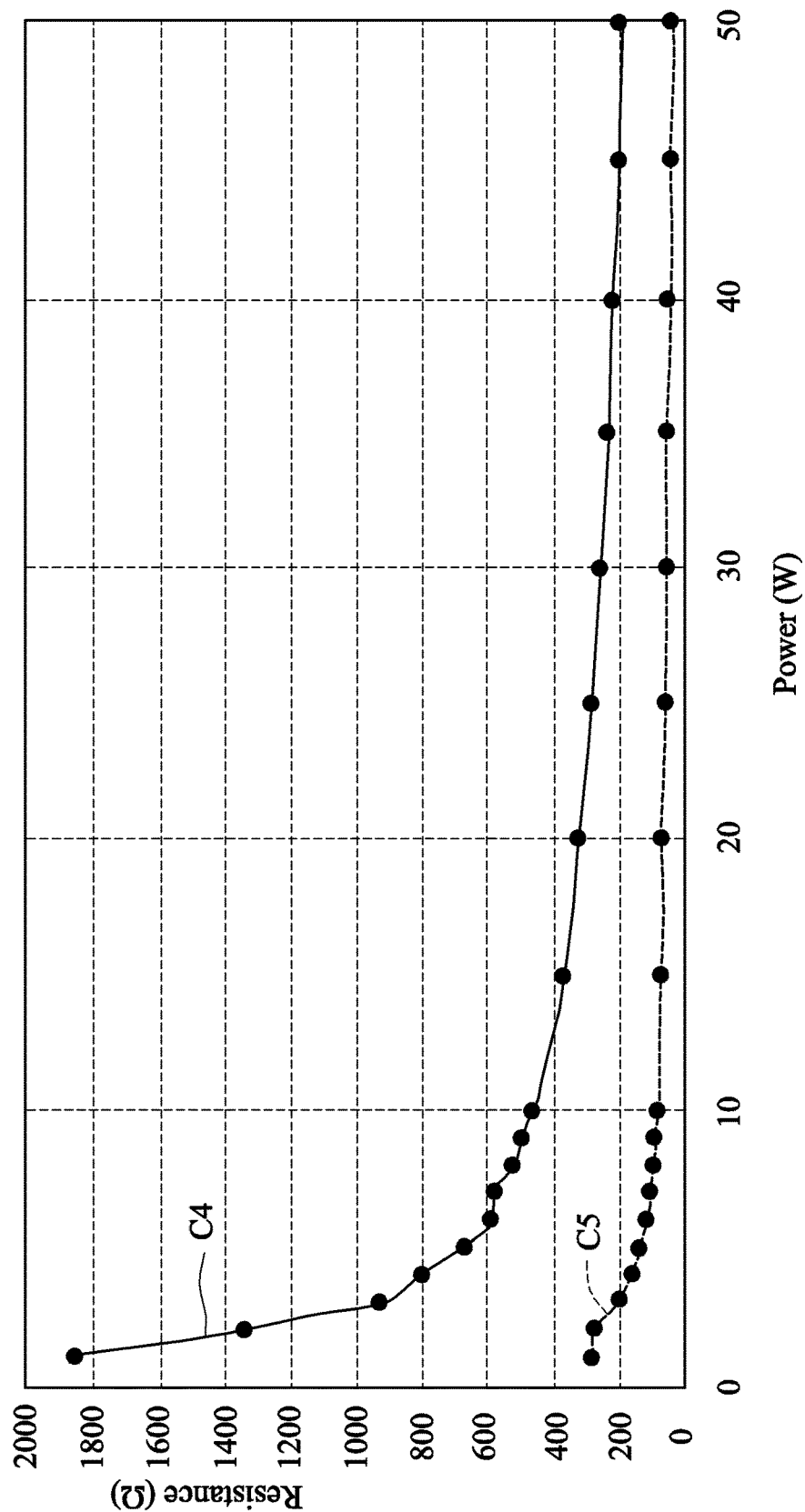

FIGS. 6A and 6B are graphs showing equivalent resistances corresponding to the plasma generated in FIGS. 4A and 4B. In FIG. 6A, the circular second part of the cathode body is used, and the flow rate of helium is 1 liter/minute (L/min). As the output power rises (from 1 W to 50 W), the resistance tends to decrease and it represents that the generated plasma is better. The curve C1 in the drawing represents the result of the pure copper electrode, the curve C2 represents the result (the turn-on field is 4.38 V/μm) of the nanocarbon material electrode (carbon nanotube electrode), and the curve C3 represents the result (the turn-on field is 2.81 V/μm) of the composite nanocarbon material electrode (graphene composite carbon nanotube electrode), wherein the turn-on field is defined as an electric field value applied when the current density reaches 10 μA/cm² in this disclosure. Therefore, the equivalent resistance value of the pure copper electrode between the power of 1 watt and the power of 50 watts is the highest, and it represents that the situation of the plasma generation is the worst, the situation of the carbon nanotube electrode is better, and the equivalent resistance value of the composite nanocarbon material electrode is the lowest, which indicates that the situation of the plasma generation is the best. From the above-mentioned results, the carbon material electrodes can generate the plasma better than that generated by the pure copper electrodes, and the plasma can be generated more easily by the electrode having the better carbon material field emission property.

As shown in FIG. 6B, the rectangular second part of the cathode body is used, the flow rate of helium is 1 L/min, the curve C4 represents the result of the pure copper electrode, and the curve C5 represents the result of the electrode made of hybrid material of carbon nanotubes (CNTs) and carbon nanoflake balls (CNFBs). According to the results corresponding to different powers, it is obtained that when the nanocarbon material is used as the cathode, the resistance value tends to decrease with the increase of power. The result that the equivalent resistance value is lower than the pure copper cathode represents that the situation of the plasma generation gets better under the situation when the nanocarbon material is used as the cathode.

There are two main reasons why carbon materials can make plasma be generated easily. First, many protruding structures are formed on the surface of the electrode after the carbon material has been deposited on the surface of the electrode. Thus, when the same energy is outputted, the stronger energy is present at the protruding structures due to the phenomenon that the energy is concentrated at the tips, so that the gas molecules can be dissociated to form the plasma more easily. Second, when the carbon material obtains the energy and the electric field is applied, the electrons inside the material will be emitted, and there will be more electrons in the environment at this time. According to the electron energy distribution theory, when there are more electrons in the environment, the electron energy distribution function is closer to the Maxwellian distribution. Therefore, there are more high-energy electrons, and the gas molecules can collide with one another more easily and can be dissociated to form the plasma.

In an example, the field emission enhanced handheld atmospheric pressure plasma generator developed in this disclosure is used to perform the surface treatment, the plasma generated by the power of 150 watts and the argon gas flow of 20 L/min is used to perform the surface treatment of the copper foil for 1 minute and 3 minutes at a distance of 1 cm, and the contact angle of the liquid droplet is measured to evaluate the effect of the plasma treatment. Table 1 lists results obtained by measuring the contact angle of the liquid droplet on the copper foil after the plasma treatment is performed for different time periods.

TABLE 1

| Time (minutes) | 0 | 1 | 3 |
|---|---|---|---|
| Contact angle (degrees) | 90.88 | 76.72 | 63.42 |

It is obtained, from Table 1, that the plasma treatment was performed for 1 minute, the contact angle of the liquid droplet is equal to 76.72 degrees smaller than that of the un-treated copper foil (90.88 degrees). The result when the plasma treatment is performed for 3 minutes is reduced to 63.42 degrees, and this represents the plasma treated copper foil become more hydrophilic. Thus, it is proved that the field emission enhanced handheld atmospheric pressure plasma generator of the invention has the ability of treating the surface of the material.

With the above-mentioned field emission enhanced handheld atmospheric pressure (open-type) plasma generator, the cathode field emission technology is adopted to enhance the plasma generating efficiency, and the energy saving effect can be provided. Therefore, the handheld atmospheric pressure plasma generator of this invention has the advantages that the volume is small, that the generator can be easily held, and that the generator can perform the flexible operation for the surface treatment of the object. In addition, the nanocarbon material functions as the emitter electrode, and the carbon material depositing process is easy and has the low cost. In addition, the user can quickly replace the electrode material or positioning member to adjust the gap, and can perform the surface treatment on the material with different gases.

While the present invention has been described by way of examples and in terms of preferred embodiments, it is to be understood that the present invention is not limited thereto. To the contrary, it is intended to cover various modifications. Therefore, the scope of the appended claims should be accorded the broadest interpretation so as to encompass all such modifications.

What is claimed is:

1. A field emission enhanced handheld atmospheric pressure plasma generator, comprising:
    a main body having a positioning slot, a receiving slot and a gas inlet;
    a cathode body having a first part and a second part connected together, wherein the first part is positioned in the positioning slot;
    an anode frame, which has an anode opening and is accommodated within the receiving slot, wherein one or each of two sidewalls of the cathode body and the anode frame facing each other has a nanocarbon material layer;
    a positioning member, which has a positioning opening and is accommodated within the receiving slot, wherein the second part of the cathode body passes through the anode frame and is partially accommodated within the positioning opening, and the second part of the cathode body is positioned and fixed by the positioning slot and separated from the anode frame by a gap; and a cover, which has a plasma channel communicating with the receiving slot and covers the main body, wherein the anode frame and the cathode body receive radio frequency power to make a gas, which enters the receiving slot from the gas inlet and passes through the gap, become plasma outputted from the plasma channel.

2. The field emission enhanced handheld atmospheric pressure plasma generator according to claim 1, wherein the sidewall of the cathode body has the nanocarbon material layer.

3. The field emission enhanced handheld atmospheric pressure plasma generator according to claim 1, wherein the sidewall of the anode frame has the nanocarbon material layer.

4. The field emission enhanced handheld atmospheric pressure plasma generator according to claim 1, wherein each of the sidewalls of the cathode body and the anode frame has the nanocarbon material layer.

5. The field emission enhanced handheld atmospheric pressure plasma generator according to claim 1, wherein the anode opening and the cathode body have corresponding circular cross sections.

6. The field emission enhanced handheld atmospheric pressure plasma generator according to claim 1, wherein the anode opening and the cathode body have corresponding rectangular cross sections.

7. The field emission enhanced handheld atmospheric pressure plasma generator according to claim 6, wherein the nanocarbon material layer comprises multiple nanocarbon material sheets respectively disposed in multiple depressed portions of the cathode body.

8. The field emission enhanced handheld atmospheric pressure plasma generator according to claim 6, wherein the nanocarbon material layer comprises multiple nanocarbon material sheets respectively disposed in multiple depressed portions of the anode frame.

9. The field emission enhanced handheld atmospheric pressure plasma generator according to claim 6, wherein the nanocarbon material layers comprise multiple nanocarbon material sheets respectively disposed in multiple depressed portions of the cathode body and multiple depressed portions of the anode frame.

10. The field emission enhanced handheld atmospheric pressure plasma generator according to claim 1, wherein an inner sidewall of the positioning member forming the positioning opening has multiple ribs, and the ribs rest against the second part of the cathode body.

11. The field emission enhanced handheld atmospheric pressure plasma generator according to claim 1, wherein the plasma channel is gradually tapered from the receiving slot, the second part of the cathode body has a first tapered surface and a second tapered surface, the first tapered surface and one sidewall of the receiving slot form a convergence channel along a flowing path of the gas, and the second tapered surface and one sidewall of the positioning opening of the positioning member form a divergence channel along a flowing path of the plasma.

12. The field emission enhanced handheld atmospheric pressure plasma generator according to claim 1, further comprising:

a radio frequency power generator, which is electrically connected to the cathode body and the anode frame, and provides the radio frequency power; and a gas supply source, which is connected to the gas inlet and provides the gas entering the receiving slot.

\* \* \* \* \*